(12) United States Patent
Fuergut et al.

(10) Patent No.: US 12,080,669 B2
(45) Date of Patent: Sep. 3, 2024

(54) SEMICONDUCTOR DEVICE MODULE HAVING VERTICAL METALLIC CONTACTS AND A METHOD FOR FABRICATING THE SAME

(71) Applicant: Infineon Technologies Austria AG, Villach (AT)

(72) Inventors: Edward Fuergut, Dasing (DE); Martin Gruber, Schwandorf (DE); Petteri Palm, Stein (DE); Bernd Schmoelzer, Radenthein (AT); Wolfgang Scholz, Olching (DE); Mark Thomas, Bodensdorf (AT)

(73) Assignee: Infineon Technologies Austria AG, Villach (AT)

( * ) Notice: Subject to any disclaimer, the term of this patent is extended or adjusted under 35 U.S.C. 154(b) by 169 days.

(21) Appl. No.: 17/482,487

(22) Filed: Sep. 23, 2021

(65) Prior Publication Data
US 2022/0102311 A1 Mar. 31, 2022

(30) Foreign Application Priority Data

Sep. 28, 2020 (EP) .................................... 20198618

(51) Int. Cl.
*H01L 23/00* (2006.01)
*H01L 23/498* (2006.01)
*H01L 23/31* (2006.01)

(52) U.S. Cl.
CPC ........ *H01L 24/20* (2013.01); *H01L 23/49811* (2013.01); *H01L 23/49833* (2013.01); *H01L 24/19* (2013.01); *H01L 23/3121* (2013.01); *H01L 23/3135* (2013.01); *H01L 24/04* (2013.01); *H01L 24/06* (2013.01); (Continued)

(58) Field of Classification Search
CPC ............... H01L 24/20; H01L 23/49811; H01L 23/49833; H01L 24/19; H01L 23/3121; H01L 23/3135; H01L 24/04; H01L 24/06; H01L 2224/04042; H01L 2224/06181; H01L 2224/214; H01L 2224/215; H01L 2924/01029; H01L 2924/13055; H01L 2924/13091; H01L 2924/15153
See application file for complete search history.

(56) References Cited

U.S. PATENT DOCUMENTS 9,860,990 B1 1/2018 Lee et al.
10,163,798 B1 * 12/2018 Alur ....................... H01L 24/16
(Continued)

FOREIGN PATENT DOCUMENTS

EP 2761653 A1 8/2014
EP 2885051 A1 6/2015

*Primary Examiner* — Fernando L Toledo
*Assistant Examiner* — Neil R Prasad
(74) *Attorney, Agent, or Firm* — Murphy, Bilak & Homiller, PLLC

(57) ABSTRACT

A semiconductor device module includes a package carrier having an opening, wherein in the opening there is disposed a semiconductor package including a semiconductor die, an encapsulant, and first vertical contacts, wherein the encapsulant at least partially covers the semiconductor die, and the first vertical contacts are connected to the semiconductor die and extend at least partially through the encapsulant, and a first outer metallic contact layer electrically connected to the first vertical contacts.

20 Claims, 6 Drawing Sheets

(52) U.S. Cl.
CPC ............. *H01L 2224/04042* (2013.01); *H01L 2224/06181* (2013.01); *H01L 2224/214* (2013.01); *H01L 2224/215* (2013.01); *H01L 2924/01029* (2013.01); *H01L 2924/13055* (2013.01); *H01L 2924/13091* (2013.01); *H01L 2924/15153* (2013.01)

(56) References Cited

U.S. PATENT DOCUMENTS

| | | | |
|---|---|---|---|
| 2008/0128755 A1* | 6/2008 | Fukamizu | ............ H01L 24/03 257/E21.627 |
| 2009/0194882 A1 | 8/2009 | Mahler et al. | |
| 2011/0095413 A1 | 4/2011 | Barth et al. | |
| 2017/0200666 A1* | 7/2017 | Hable | ................ H01L 21/565 |
| 2018/0166356 A1 | 6/2018 | Butt et al. | |
| 2019/0131273 A1* | 5/2019 | Chen | .................. H01L 21/568 |
| 2019/0295939 A1 | 9/2019 | Ko et al. | |
| 2019/0363043 A1 | 11/2019 | Gottwald et al. | |
| 2020/0176384 A1* | 6/2020 | Wu | ................. H01L 21/4857 |
| 2021/0249334 A1* | 8/2021 | Fuergut | ................ H01L 21/56 |

* cited by examiner

SEMICONDUCTOR DEVICE MODULE HAVING VERTICAL METALLIC CONTACTS AND A METHOD FOR FABRICATING THE SAME

TECHNICAL FIELD

The present disclosure is related to a semiconductor device module comprising an embedded semiconductor die and vertical metallic contacts for electrically connecting the contact pads of the semiconductor die with outer metallic contact layers.

BACKGROUND

Over the last couple of years a lot of activities have been carried out concerning the embedding of passive components and active semiconductor dies into PCB or package carrier systems. Some low voltage use cases have found their way into production as embedding provides additional value compared to module or discrete packaging solutions, such as compactness (power density), short lead lengths leading to remarkably low parasitic inductances, good thermal management and significantly improved power cycling capability. These benefits are also seen to be attractive for power applications with high voltages up to 1200 V and specially for fast switching applications >20 kHz. Nevertheless, some existing blocking points, when looking at how chip embedding is done today, have to be solved first as in the future peak voltages of 1700V, 2000V or even higher are under consideration.

The current chip embedding process does not fulfil high voltage application requirements. The breakdown voltage, halogen impurity level and the overall reliability of current PCB materials that are used for chip embedding are not suitable for 600 V devices. Also the isolation distance between the chip edge and the routing layer on top of the module is limited and the distance is typically 50-100 µm at maximum.

For these and other reasons there is a need for the present disclosure.

SUMMARY

A first aspect of the present disclosure is related to a semiconductor device module, comprising a package carrier comprising an opening, wherein in the opening there is disposed a semiconductor package comprising a semiconductor die, an encapsulant, and first vertical contacts, wherein the encapsulant at least partially covers the semiconductor die, and the first vertical contacts are connected to the semiconductor die and extend at least partially through the encapsulant, and a first outer metallic contact layer electrically connected to the first vertical contacts.

A second aspect of the present disclosure is related to a method for fabricating a semiconductor device module, the method comprising fabricating a semiconductor die package by providing a semiconductor die, connecting first vertical contacts to the semiconductor die, covering at least partially the semiconductor die by an encapsulant so that the first vertical contacts extend at least partially through the encapsulant, providing a package carrier comprising an opening, placing the semiconductor die package in the opening, and electrically connecting a first outer metallic contact layer to the first vertical contacts.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description.

The elements of the drawings are not necessarily to scale relative to each other. Like reference numerals designate corresponding similar parts.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "top", "bottom", "front", "back", "leading", "trailing", etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present disclosure. The following detailed description, therefore, is not to be taken in a limiting sense, and the scope of the present disclosure is defined by the appended claims.

It is to be understood that the features of the various exemplary embodiments described herein may be combined with each other, unless specifically noted otherwise.

As employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the word "over" used with regard to a part, element or material layer formed or located "over" a surface may be used herein to mean that the part, element or material layer be located (e.g. placed, formed, deposited, etc.) "indirectly on" the implied surface with one or more additional parts, elements or layers being arranged between the implied surface and the part, element or material layer. However, the word "over" used with regard to a part, element or material layer formed or located "over" a surface may, optionally, also have the specific meaning that the part, element or material layer be located (e.g. placed, formed, deposited, etc.) "directly on", e.g. in direct contact with, the implied surface.

Figure 1:
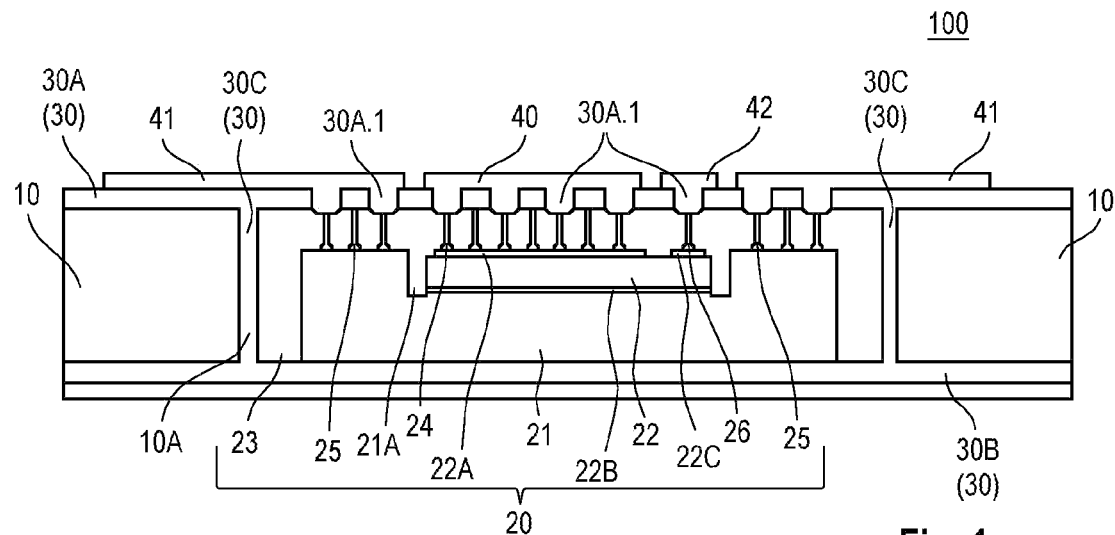
FIG. 1 shows a schematic cross-sectional side view representation of an example of a semiconductor device module which comprises outer metallic contact layers on only one of two main faces of the module and in which the die carrier comprises a recess.

FIG. 1 shows a schematic cross-sectional side view representation of an exemplary semiconductor device module.

More specifically, FIG. 1 shows a semiconductor device module 100 comprising a package carrier 10 being essentially composed of a polymer layer, in particular an FR 4 layer, the package carrier 10 having an opening or recess 10A. In the opening 10A a die carrier 21 is arranged wherein the die carrier 21 comprises a recess area 21A in which a semiconductor die 22 is disposed so that side walls of the semiconductor die 22 are spaced from inner side walls of the recess area 21A. The die carrier 21 and the semiconductor die 22 are partly embedded by an encapsulant 23 so that an upper main face and side walls of the die carrier 21 are covered by the encapsulant 23, and also the recess area 21A is filled by the encapsulant 23 so that an intermediate space between side walls of the semiconductor die 22 and inner walls of the recess area 21A is filled by the encapsulant 23. The die carrier 21, the semiconductor die 22, and the encapsulant form a semiconductor die package 20. In a fabrication process of the semiconductor device module, at first the semiconductor die package 20 can be formed and thereafter placed into the opening portion 10A of the package carrier 10. The fabrication process of the semiconductor die package 20 will be described later in more detail.

The package carrier 10 should in general be suitable to receive and support the semiconductor die package 20 in the opening 10A of the package carrier 10. In particular, the package carrier 10 can be one or more of an insulator layer, a laminate layer, an FR4 layer, a ceramic layer, a glass layer, a metallic layer, in particular a Cu or Al layer, a printed circuit board, or any combination of these layers.

The semiconductor die 22 comprises a first upper main face on which a first contact pad 22A is disposed, and a second lower main face opposite to the first surface on which second main face a second contact pad 22B is disposed. A third contact pad 22C is disposed on the first main face. The semiconductor die 22 is attached with its second contact pad 22B to the bottom of the recess area 21A of the die carrier 21. The first, second and third contact pads 22A to 22C can be the source, drain, and gate contact pads of an IGBT semiconductor die 22.

More generally, the semiconductor die 22 can be one or more of a vertical transistor die, a MOSFET die, an IGBT die, a SiC-MOS die, a Cool-MOS die, or an S-FET die. Furthermore the semiconductor die 22 can be fabricated from Si, or from a wide bandgap semiconductor material like SiC or GaN.

The semiconductor device module 100 further comprises a polymer layer 30 which may essentially completely cover the package carrier 10 which means that the polymer layer 30 comprises a first horizontal upper layer 30A, a second horizontal lower layer 30B and left and right vertical layers 30C between the first and second layers 30A and 30B which vertical layers 30C may have the form of a contiguous ring which surrounds the opening area 10A of the package carrier 10. The polymer layer 30 may be formed by laminating which will be explained later.

In the following the electrical connections to the contact pads will be described in more detail whereas the fabrication of these electrical connections will be described later in more detail.

One essential feature of the present disclosure is the use of metallic contacts as one part of the electrical connections. In particular, the semiconductor die package 20 comprises a first plurality of vertical contacts 24 which are connected to the source pad 22A. The vertical contacts 24 may have an elongated linear shape and extend in a vertical direction through the encapsulant 23. They extend at least to an upper main face of the encapsulant 23 or they can also extend beyond the upper main face of the encapsulant 23. The first vertical contacts 24 can be made of Cu and they can be attached to the source pad 22A by means of nail head bonding. The source pad 22A can also be partitioned into a plurality of small sub-pads (not shown in the Figure) and each one of the sub-pads can be connected with one or more of the first vertical contacts 24.

Furthermore the semiconductor die package 20 may contain a second plurality of vertical contacts 25 which are connected to the upper surface of the die carrier 21 so that they are electrically connected with the drain pad 22B. As shown in FIG. 1, the vertical contacts 25 can be attached on opposing sides of the upper surface of the die carrier 21 across the opening area 10A of the package carrier 10.

Furthermore the semiconductor die package 20 may contain a third single vertical contact 26 which is connected to the gate pad 22C of the semiconductor die 22. Even more contact pads and respective vertical contacts can be provided to enable sense functions like temperature or current sense functions, or even other functions.

As regards the dimensions of the vertical contacts 24, 25, 26 a length of the vertical contacts 24, 25, and 26 lies in a range from 30 µm to 1 mm, more specifically from 50 µm to 500 µm, more specifically from 100 µm to 300 µm. A thickness or lateral diameter of the vertical contacts 24, 25, and 26 lies in a range from 20 µm to 150 µm, more specifically from 50 µm to 100 µm.

For further electrically connecting the vertical contacts 24, 25, and 26, via connections 30A.1 are formed into the first upper polymer layer 30A by first forming through-holes 30A_1 and then filling the through-holes with a metallic material. The via connections 30A.1 are formed into in the first polymer layer 30A so that they extend to the vertical contacts 24, 25, and 26. Different methods for forming the through-holes will be presented later. As can be seen in FIG.

1, it is not necessary to form via connections 30A.1 to any one of the vertical contacts 24 and 25, so some of the vertical contacts 24 and 25 can be left unconnected.

The via connections 30A.1 can be filled with a metal like Cu by galvanic plating and afterwards outer metallic contact layers 40, 41, 42 can be applied onto the via connections 30A.1. As can be seen in FIG. 1, a first outer metallic area 40 can thus be electrically connected with the source pad 22A, second outer metallic areas 41 can be electrically connected with the drain pad 22B, and a third outer metallic contact layer 42 can be electrically connected with the gate pad 22C.

As can be seen in FIG. 1, the outer metallic contact layers 40, 41, and 42 are provided on only one of the main faces of the semiconductor device module 100. The second plurality of vertical contacts 25 can be connected with two different outer metallic contact layers 41.

One specific advantage of the present disclosure is that it allows to reduce parasitic inductances of the electrical connections down to a range from 1 nH to 10 nH, more specifically 1 nH to 5 nH, more specifically to 1 nH to 2 nH.

One further advantage of the present disclosure relates to the fabrication process which will be described later. In particular, the fabrication process comprises independently pre-fabricating the one or more semiconductor die packages and then placing the pre-fabricated semiconductor die package(s) into one or more openings of the package carrier. This has several advantages, among them the possibility of testing the one or more semiconductor die packages on their functionality and only after a positive test placing them into openings of the package carriers. This is particularly important for high voltage semiconductor transistor devices. Furthermore, when pre-fabricating the semiconductor die package(s) they can be constructed in an optimal manner as regards interaction between the encapsulant and the semiconductor die, adhesion between encapsulant and semiconductor die, and also optimum electrical isolation against high voltages.

One further advantage of the present disclosure is that it allows to fabricate a very small area of the gate pad 22C. Due to the nail head bonding process and depending on the lengths of the vertical contacts 24, 25, and 26 as given above it is possible to reduce the gate pad area down to a range from 300 µm×300 µm to 400 µm×400 µm. In case of contact diameters of 30 µm, even gate areas in a range from 50 µm×50 µm to 100 µm×100 µm should be possible. The same applies to the areas of additional pads like temperature or current sense pads.

In the example as shown in FIG. 1 the carrier 21 is comprised of a metal block like a portion of a leadframe and the carrier comprises a recessed area. It is also possible that the carrier does not comprise the recessed area and the semiconductor die will be placed onto a plane upper surface of the carrier. Moreover, the carrier can also be comprised of a direct copper bond (DCB), an active metal braze (AMB), or an isolated metal substrate (IMS) or even other carrier systems like, e.g. leadframe or laminate based carrier systems.

The encapsulant 23 can be comprised of a conventional mold compound like, for example, a resin material, in particular an epoxy resin material. Moreover, the encapsulant 23 can be applied in different aggregate states as, for example, in liquid form, as pellets, or as a granulate. Moreover, the encapsulant 23 can be made of a thermally conductive material to allow efficient heat dissipation to external metallic heat sinks. The material of the encapsulant 23 can, in particular, comprise a resin like an epoxy resin material filled with thermally conductive particles like, for example, made of $Al_2O_3$, BN, AlN, $Si_3N_4$, diamond, or any other thermally conductive particles. The encapsulant 23 can also be made of a plateable mold compound.

It should further be mentioned that the semiconductor die package 20 may be fabricated so that the lateral dimensions of the die carrier 21 correspond to or are only slightly smaller than the lateral dimensions of the opening 10A so that the side walls of the die carrier 21 are in direct contact with the side walls of the opening 10A. A specific example thereof will be shown and described in connection with FIG. 2 below.

The present disclosure also relates to system modules in which two or more semiconductor device modules are integrated in a package carrier such as in FIG. 1 and electrically connected with each other to form one or more of a B6 half bridge, an H bridge, a parallel connection between any switching component and/or an antiparallel freewheeling diode, SR topologies, buck-boost converters, DC/DC converters, or AC-switches.

Furthermore other electrical or electronic devices can be integrated with the semiconductor device module such as, for example, gate drivers, controllers, sensors, connectivity devices (Bluetooth or WiFi devices), passive devices etc. Such devices can be embedded in the package carrier in the same way as the semiconductor die or they can be placed on an outer surface of the package carrier.

Figure 2:
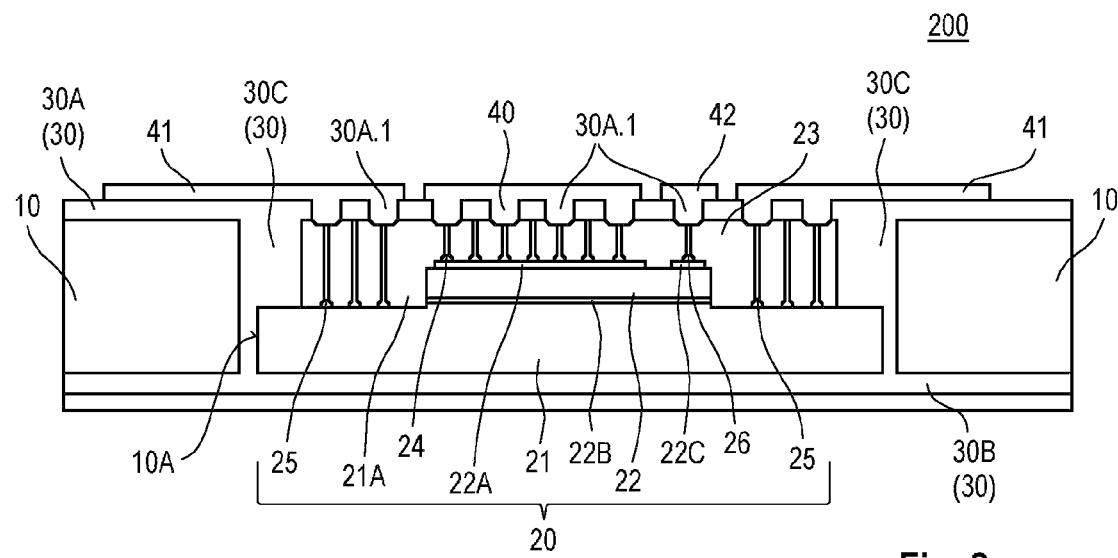
FIG. 2 shows a schematic cross-sectional side view representation of an example of a semiconductor device module which comprises outer metallic contact layers on only one of two main faces of the module and in which the die carrier does not comprise a recess. In addition to this the encapsulant is only provided in a central area and does not extend to the side walls of the opening of the package carrier so that the side wall of the die carrier is not covered by the encapsulant.

FIG. 2 shows a schematic cross-sectional side view representation of an example of a semiconductor device module in which as compared with FIG. 1 the die carrier does not comprise a recess. In addition to this the side wall of the die carrier is not covered by the encapsulant and the encapsulant is only provided in a central area and does not extend to the side walls of the opening of the package carrier.

More specifically, FIG. 2 depicts a semiconductor device module 200 which is similar to the semiconductor device module 100 of FIG. 1 so that most of the reference signs of FIG. 1 were adopted. The semiconductor device module 200 of FIG. 2 comprises a semiconductor die package 20. As a difference to FIG. 1, the semiconductor die package 20 comprises a die carrier 21 which does not comprise a recess area such as the recess area 21A of the die carrier 21 as shown in FIG. 1. Instead the semiconductor die package 20 is constructed so that semiconductor die 22 is placed onto a plane upper main surface of the die carrier 21. Consequently the second plurality of vertical metallic contacts 25 have to be formed significantly longer than those shown in FIG. 1 as they have to reach from an upper surface of the encapsulant 23 down to the upper main face of the die carrier 21.

As was mentioned before in connection with FIG. 1, in the example of FIG. 2 the semiconductor die package 20 may furthermore be fabricated so that the lateral dimensions of the die carrier 21 correspond to or are only slightly smaller than the lateral dimensions of the opening 10A so that the side walls of the die carrier 21 are in direct contact with the side walls of the opening 10A. A further amendment as compared to FIG. 1 is that the encapsulant 23 is only provided in a central area above the semiconductor die 22 and the vertical layer 30C of the laminate layer 30 is formed thicker above the die carrier 21.

It should be added that further embodiments can be formed by amending the embodiment of FIG. 1 only in one aspect as for example only omitting the recess 21A and leaving the lateral extensions of the encapsulant 23, or leaving the recess 21A and amending the lateral extensions of the encapsulant 23.

Figure 3:
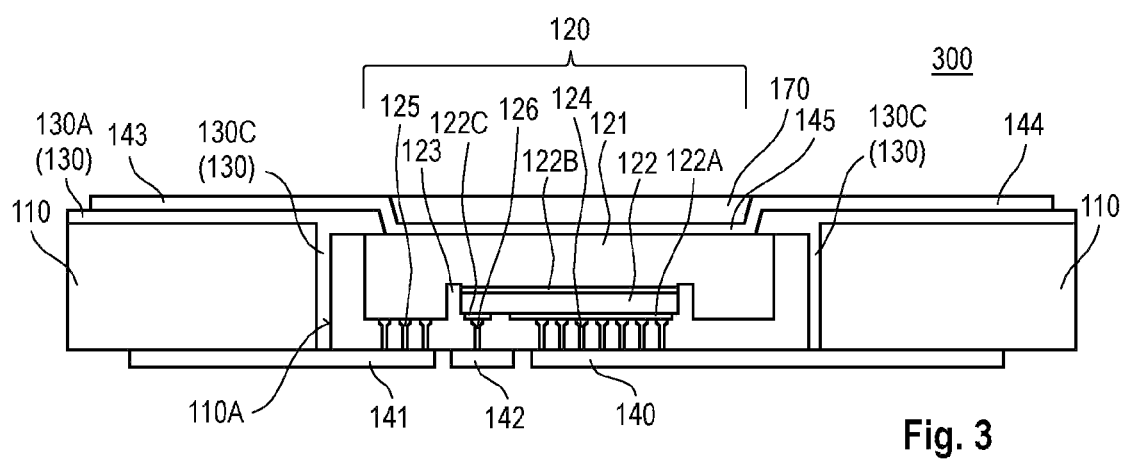
FIG. 3 shows a schematic cross-sectional side view representation of an example of a semiconductor device module which comprises outer metallic contact layers on both main faces of the module.

FIG. 3 shows another example of a semiconductor device module.

More specifically, a structure of the semiconductor device module 300 according to FIG. 3 is similar to the one of the semiconductor device module 100 of FIG. 1. The semiconductor device module 300 is shown in an upside down manner as compared to FIGS. 1 and 2 and comprises a package carrier 110 including an opening or recess 110A, a semiconductor die package 120 including a die carrier 121, a semiconductor die 122, a first plurality of vertical contacts 124, a second plurality of vertical contacts 125, a single vertical contact 126, and an encapsulant 123, and furthermore a laminate layer 130, and first, second, third, forth, and fifth outer electrical contact layers 140, 141, 142, 143, 144. The properties of these elements are similar to those of the semiconductor device module 100 of FIG. 1 and will not be repeated here.

As compared to the semiconductor device module 100 of FIG. 1, the laminate layer 130 is only applied on one of the main surfaces of the package carrier 110, namely on the upper main surface in FIG. 3, hence it comprises only one first horizontal upper layer 130A, and left and right side vertical layers 130C which may have the form of a contiguous ring which surrounds the opening area 110A of the package carrier 110.

Another difference to the semiconductor device module 100 of FIG. 1 is related to the electrical connecting of the drain pad 122B. Similar to FIG. 1, the drain pad 122B is connected with the die carrier 121 and the die carrier 121 is connected with the second plurality of vertical contacts 125 which are connected with the second outer metallic area 141. However, going beyond this way of connecting the drain pad 122B, in addition a back surface of the die carrier 121 is connected with a metallic layer 145, and this metallic layer 145 is then connected with two outer metallic contact layers 143 and 144. Such a semiconductor device module 300 presents more flexibility in connecting it to an external electrical device.

It should be added that also the semiconductor device module 300 can be constructed such that the semiconductor die package 120 comprises a die carrier 121 which does not comprise a recess area and instead the semiconductor die 122 is placed onto a plane upper main surface of the die carrier 121. As was mentioned in connection with FIG. 2, the second plurality of vertical metallic contacts 25 have to be formed significantly longer than those shown in FIG. 3 as they have to reach from a main lower surface of the encapsulant 123 up to the lower main face of the die carrier 121.

Figure 4:
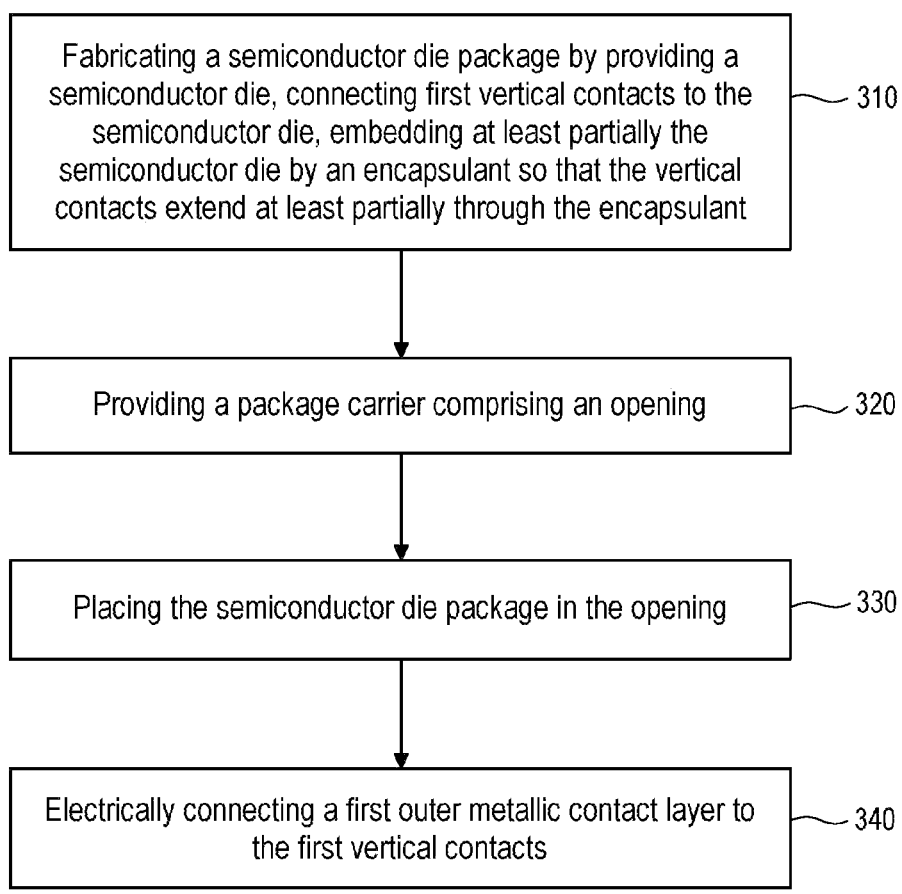
FIG. 4 shows a flow diagram of an exemplary method for fabricating a semiconductor device module.

FIG. 4 shows a flow diagram of an exemplary method for fabricating a semiconductor device module.

The method 400 for fabricating a semiconductor device module comprises 310 fabricating a semiconductor die package by providing a semiconductor die, connecting first vertical contacts to the semiconductor die, embedding at least partially the semiconductor die by an encapsulant so that the vertical contacts extend at least partially through the encapsulant, providing 320 a package carrier comprising an opening, placing 330 the semiconductor die package in the opening, and 340 electrically connecting a first outer metallic contact layer to the first plurality of vertical contacts.

According to an example of the method 400 of FIG. 4, connecting the vertical contacts to the contact pads of the semiconductor die comprises nail head bonding.

According to an example of the method 400 of FIG. 4, fabricating the semiconductor die package further comprises providing a die carrier and disposing the semiconductor die on the die carrier.

According to an example of the method 400 of FIG. 4, embedding the semiconductor die by an encapsulant comprises compression molding or transfer molding. According to a further example of the method 300 of FIG. 4, embedding the semiconductor die by an encapsulant comprises film-assisted molding. In this way it is possible to perform the molding so that the vertical contacts extend until an upper surface of the encapsulant and are exposed to the outside. As an alternative, it is also possible not to perform normal molding without film-assistance, and then remove the encapsulant from above until the vertical contacts are reached. Removing the encapsulant can be performed by any kind of deflashing process like e.g. laser ablation, etching, water jet blasting etc.

Further embodiments of the method 400 can be formed by adding aspects or features which were described above in connection with the semiconductor device module according to the first aspect.

FIGS. 5A to 5E show schematic cross-sectional side view representations for illustrating an exemplary method for fabricating the semiconductor device module as shown in FIG. 1.

Figure 5A:
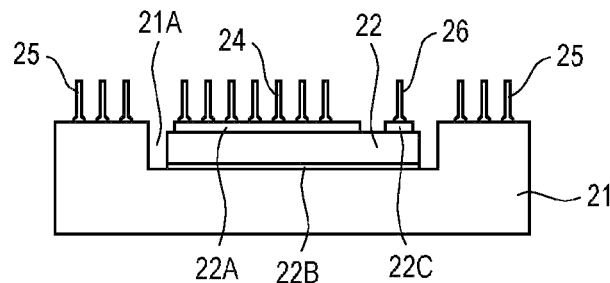
FIGS. 5A to 5E show schematic cross-sectional side view representations for illustrating an exemplary method for fabricating the semiconductor device module as shown in FIG. 1, wherein the enlarged section of FIG. 5D shows a cross-sectional view of a through-hole drilled into an uppermost seed layer and a laminate layer.

FIG. 5A shows a metallic die carrier 21 which can be made of Cu or a Cu alloy. The die carrier 21 may have a quadratic ground form and may have a recess area 21A which can be formed within the upper main face of the die carrier 21 and have equal distance to the side edges of the die carrier 21. A semiconductor die 22, in particular an IGBT die, comprises an emitter contact pad 22A, a collector contact pad 22B, and a gate contact pad 22C and is inserted into the recess area 21A by connecting it with its collector contact pad 22B to the bottom plane of the recess area 21A. Then a first plurality of vertical contacts 25 is connected to the emitter contact pad 22A, a second plurality of vertical contacts is connected to an upper surface of the die carrier 21, and a single vertical contact 26 is connected to the gate contact pad 22C. The vertical contacts 24, 25, and 26 can be connected to the respective contact pads by nail head bonding.

Figure 5B:
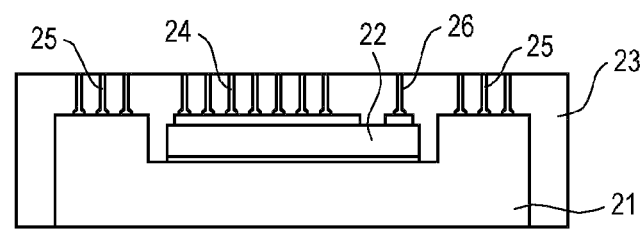
Figure 5C:
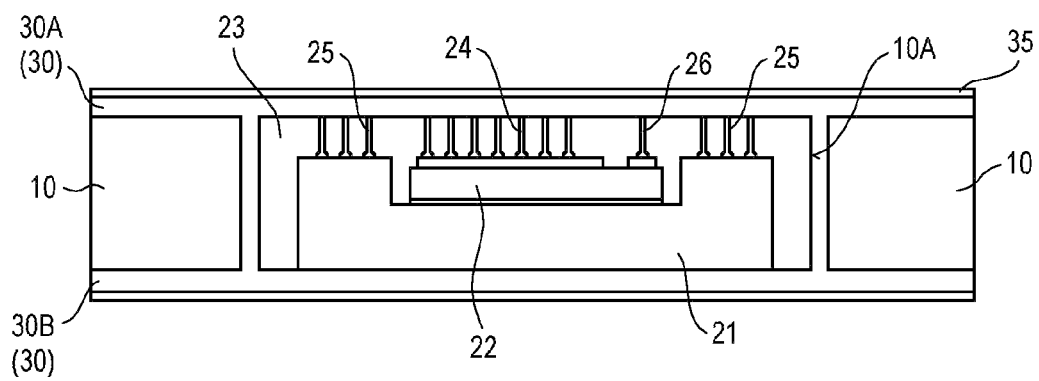

FIG. 5B shows the finished semiconductor die package 20 after applying an encapsulant to the die carrier 21 and the semiconductor die 22 in such a way that a lower main surface of the die carrier 21 is not covered by the encapsulant 23. Applying the encapsulant 23 can be done, for example, by liquid compression molding. The molding process can be performed so that the vertical contacts 24, 25, and 26 are exposed to the outside. This can be achieved either by performing film-assisted molding or by normal molding and/or afterwards removing the encapsulant from the above by any kind of deflashing as mentioned before until the upper tops of the vertical contacts will be reached. However, it is also possible to apply the encapsulant 23 in such a way that the vertical contacts 24, 25, and 26 are not exposed to the outside. I FIG. 5C shows an intermediate product after placing the semiconductor die package 20 into an opening 10A of a package carrier 10, and thereafter applying a laminate layer 30 onto the package carrier 10, resulting in laminate layers 30A, 30B, and 30C as was already described above. The vertical laminate layers 30C result from laminate material flowing into the intermediate space between side walls of the semiconductor die package 20 and inner side walls of the opening area 10A of the package carrier 10. Furthermore metallic seed layers 35 are deposited by, for example, sputtering onto the laminate layers 30A and 30B. It is also possible that the seed layers 35 are provided on the laminate layer 30 before applying the laminate layer 30 onto the package carrier 10.

Figure 5D:
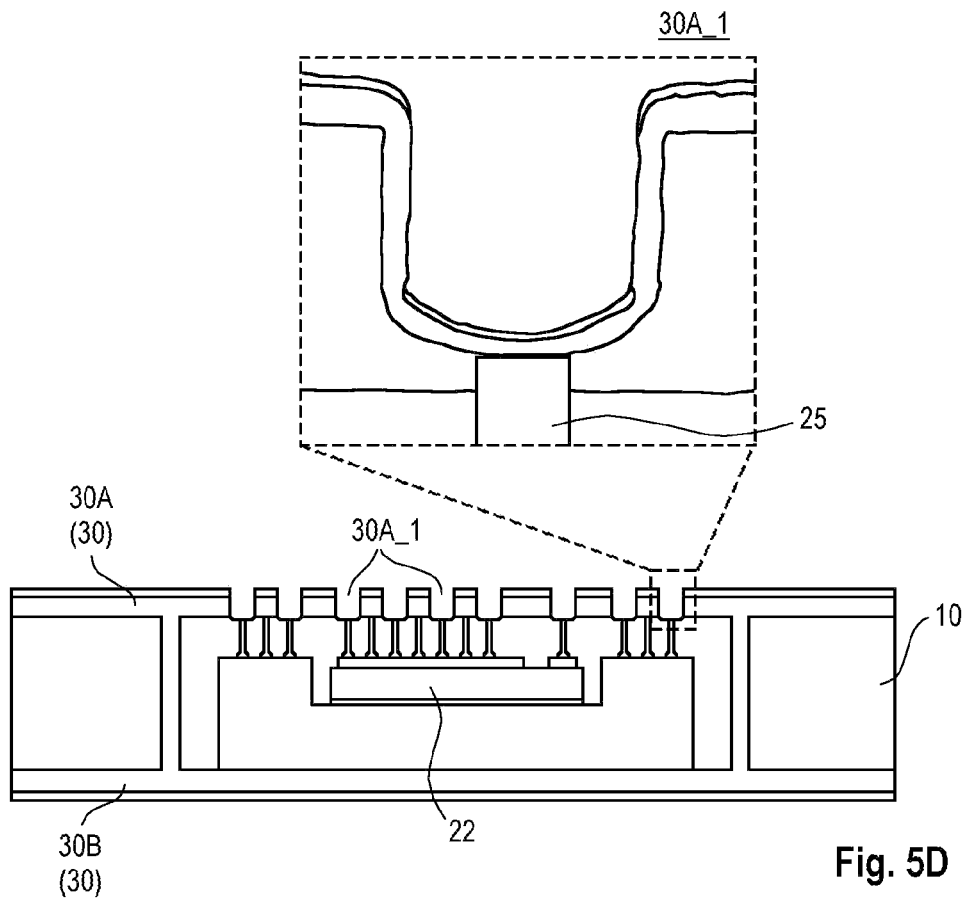

FIG. 5D shows an intermediate product after forming through-holes 30A_1 into the upper laminate layer 30A and the overlying seed layer 35. Forming the through-holes 30A_1 can be done by mechanical drilling, laser drilling, or plasma etching. On the right side of FIG. 5D an enlarged partial view shows a cross-section through one of the through-holes 30A_1. The through-holes 30A_1 are formed so that they reach until the upper tops of the vertical contacts 24, 25, and 26. They can have a depth in a range from 50 μm to 500 μm, in particular from 100 μm to 300 μm, and a width in a range from 50 μm to 500 μm, wherein 80 μm to 150 μm is most likely with 50 mm to 100 μm layer thickness. The size of the through-holes 30A_1 can be about the same size as the insulation layer thickness. It can also be seen that through-holes 30A_1 are formed not above every one of the contacts 24 and 25. The through-holes 30A_1 can have a larger diameter than the vertical contacts 24, 25, and 26.

Figure 5E:
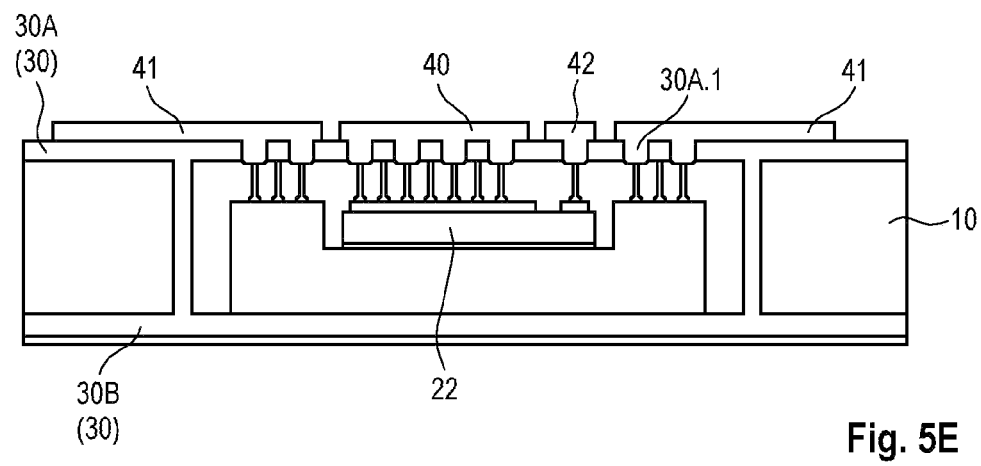

FIG. 5E shows a semiconductor device module after forming the outer metallic contact layers. Before this can be done, a seed layer will have to be deposited by sputtering or electroless plating into the through-holes 30A_1. The through-holes 30A_1 are filled by galvanic plating with a metallic material, in particular Cu or a Cu alloy, and thus turned into electrical trough-connections 30A.1. Thereafter a further galvanic plating of Cu or a Cu alloy is performed to create a first outer metallic contact layer 40 which is connected with the first plurality of vertical contacts 24, second outer metallic areas 41 which are connected with the second plurality of vertical contacts 25, and a third outer metallic contact layer 42 which is connected with the single vertical contact 26.

Figure 6A:
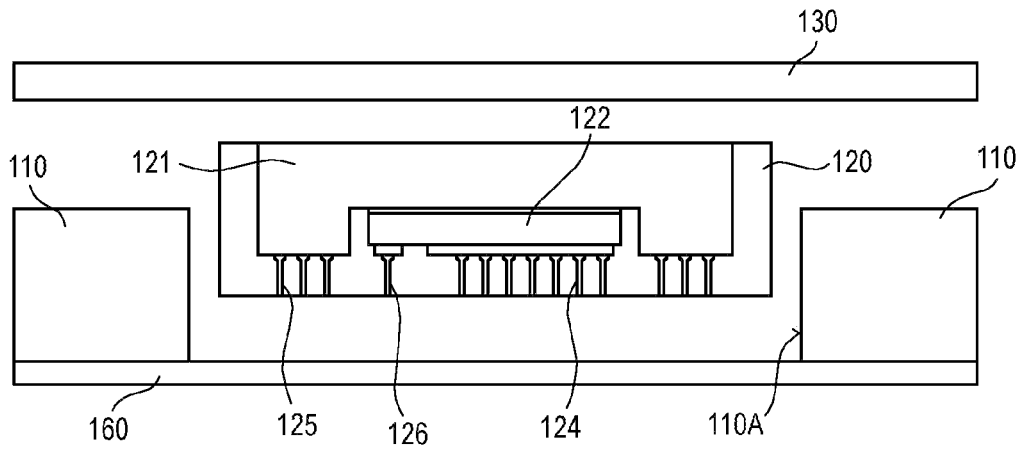
FIGS. 6A to 6C show schematic cross-sectional side view representations for illustrating an exemplary method for fabricating the semiconductor device module as shown in FIG. 3.
Figure 6B:
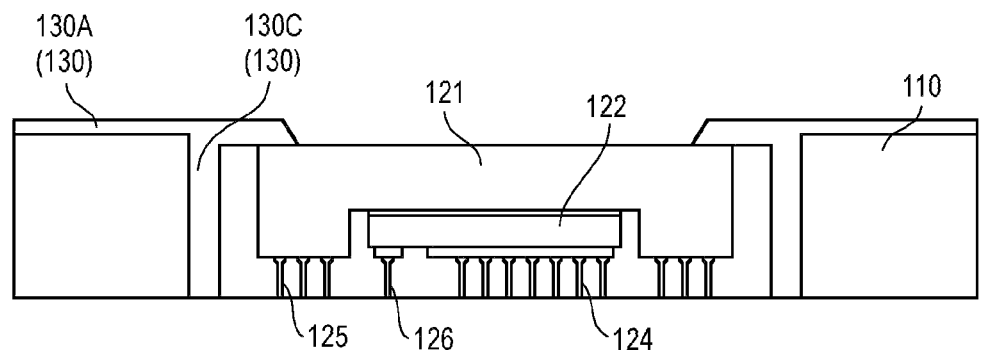
Figure 6C:
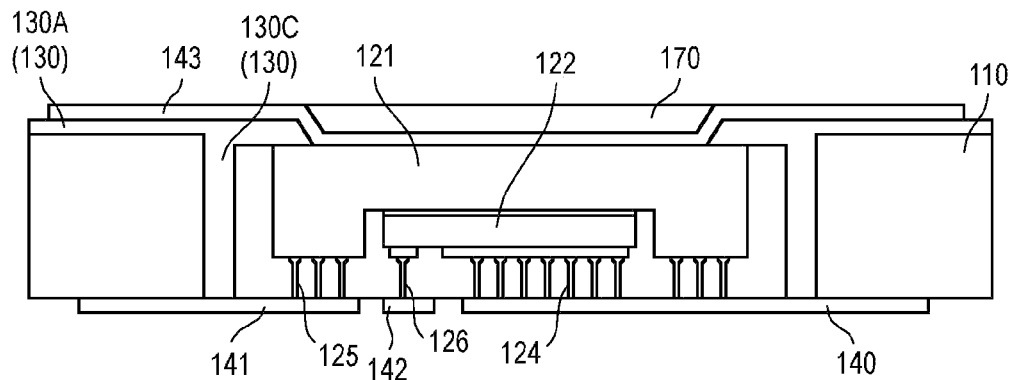

FIGS. 6A to 6C show schematic cross-sectional side view representations for illustrating an exemplary method for fabricating the semiconductor device module as shown in FIG. 3.

FIG. 6A shows a situation shortly before placing a semiconductor die package 120 into an opening area 110A of a package carrier 110. Prior to this an adhesive foil 160 was attached to the lower surface of the package carrier 110. The semiconductor die package 120 comprises a die carrier 121, a semiconductor die 122, and an encapsulant 123, a first plurality of vertical contacts 124, a second plurality of vertical contacts 125, and a single vertical contact 126. The structure of the semiconductor die package 120 was described in more detail in connection with FIG. 3.

After placing the semiconductor die package 120 in the opening area 110A of the package carrier 110, a polymer layer 130 is laminated onto an upper surface of the package carrier 110 so that the polymer material also flows into the intermediate space between side faces of the semiconductor die package 120 and inner walls of the opening area 110A of the package carrier 110.

FIG. 6B shows an intermediate product after removing a portion of the laminate layer 130A which portion covers most of the area of the back surface of the die carrier 121. Removing the portion of the polymer layer 130A can be performed by mechanical drilling or etching.

FIG. 6C shows a semiconductor device module after forming the outer metallic contact layers. Before this can be done, a seed layer will have to be deposited onto the areas. Thereafter a galvanic plating of Cu or a Cu alloy is performed to create a first outer metallic contact layer 140 which is connected with the first plurality of vertical contacts 124, a second outer metallic contact layer 141 which is connected with the second plurality of vertical contacts 125, a third outer metallic contact layer 142 which is connected with the single vertical contact 26, and a forth outer metallic contact layer 143 which is connected with the backside of the die carrier 121. Finally an insulation layer 170 is deposited onto a central portion of the forth outer metallic contact layer 143. It should be added that one could have either one of the second outer metallic layer 141 or the forth outer metallic layer 143. So either one of these could also be omitted.

FIGS. 7A to 7D show schematic cross-sectional side view representation for illustrating different methods of drilling holes into the laminated polymer layer.

Figure 7A:
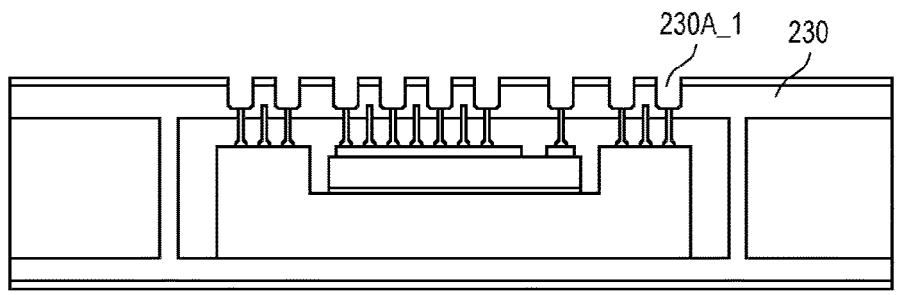
FIGS. 7A to 7D show schematic cross-sectional side view representation for illustrating different methods of drilling holes into the laminate layer or the encapsulant like mechanical drilling within the laminate layer (A), mechanical drilling through the laminate layer and into the encapsulation layer (B), creating large area openings by plasma etching or water blasting (C), and drilling holes by laser drilling (D).
Figure 7B:
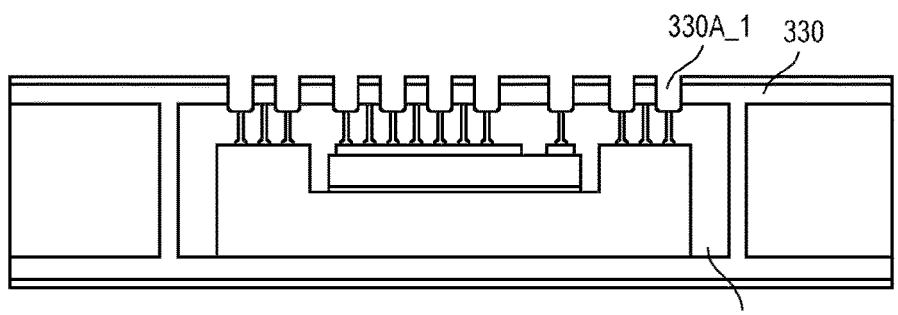

FIGS. 7A and 7B show examples of mechanically drilling the holes.

According to the example of FIG. 7A, the vertical contacts are extending beyond the upper surface of the encapsulant so that the holes 230A_1 have to be drilled into the overlying seed layer and only into the polymer layer 230 until the top tips of the vertical contacts are reached.

According to the example of FIG. 7B, the vertical contacts are extending to exactly the upper surface of the encapsulant 323 so that the holes 330A_1 have to be drilled into the polymer layer 330 and partly into the encapsulant 323 to ensure that the subsequently plated metal is reliably electrically connected with the vertical contacts.

Figure 7C:
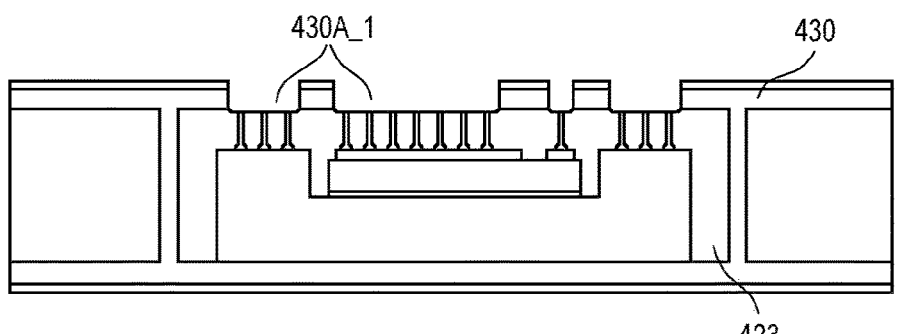
Figure 7D:
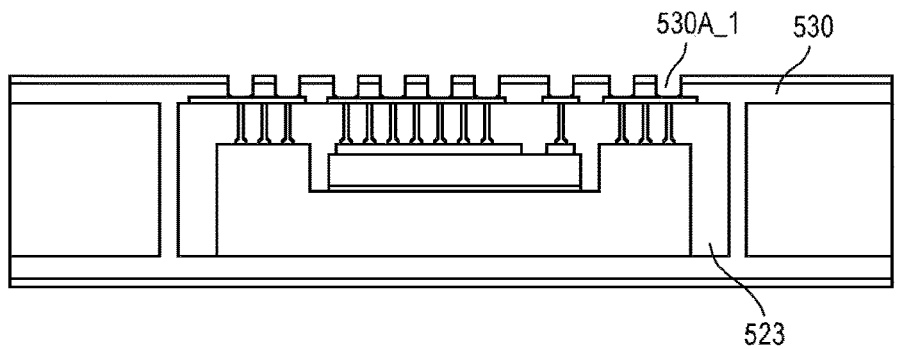

FIGS. 7C and 7D show examples of other methods of drilling the holes.

According to the example of FIG. 7C, the vertical contacts are extending to exactly the upper surface of the encapsulant 423. In this example large area openings 430A_1 are created in the polymer layer 430 which openings 430A_1 extend over the entire areas above the pluralities of vertical contacts. The openings 430A_1 can be created by plasma etching or water blasting.

According to the example of FIG. 7D, the vertical contacts are extending to exactly the upper surface of the encapsulant. Before laminating the polymer layer 530, seed layers are formed onto the upper surface of the encapsulant 523 so that the seed layers are connected with the pluralities of vertical contacts. Thereafter the polymer layer 530 is laminated followed by the deposition of a further seed layer onto the upper surface of the polymer layer 530. Thereafter the holes 530A_1 are formed by laser drilling into the polymer layer 530.

In the following specific examples of the present disclosure are described.

Example 1 is a semiconductor device module comprising a package carrier comprising an opening, wherein in the opening there is disposed a semiconductor package comprising a semiconductor die, an encapsulant, and first vertical contacts, wherein the encapsulant at least partially covers the semiconductor die, and the first vertical contacts are connected to the semiconductor die, and a first outer metallic contact layer electrically connected to the first vertical contacts.

Example 2 is the semiconductor device module according to Example 1, wherein the vertical contacts extend at least partially through the encapsulant.

Example 3 is the semiconductor device module according to Example 1 or 2, further comprising a die carrier disposed in the opening of the package carrier, the semiconductor die being disposed on the die carrier.

Example 4 is the semiconductor device module according to any one of the preceding Examples, wherein the semiconductor die comprises a first main face and a second main face opposite to the first main face, the first contact pad being disposed on the first main face, the semiconductor die further comprises a second contact pad on the second main face.

Example 5 is the semiconductor device module according to any one of the preceding Examples, wherein the semiconductor die is a power semiconductor transistor die.

Example 6 is the semiconductor device module according to any one of the preceding Examples, wherein the vertical contacts have the form of vertical needles or vertical wires.

Example 7 is the semiconductor device module according to any one of the Examples 4 to 6, further comprising second vertical contacts connected with the second contact pad and extending through the encapsulant.

Example 8 is the semiconductor device module according to Example 7, further comprising a second outer metallic contact layer electrically connected to the second vertical contacts.

Example 9 is the semiconductor device module according to any one of Examples 4 to 8, wherein the semiconductor die is a semiconductor transistor die, and the first contact pad is a source contact pad, and the second contact pad is a drain contact pad.

Example 10 is the semiconductor device module according to anyone of Examples 4 to 9, the semiconductor die further comprises a third contact pad being disposed on the first main face, the third contact pad being a gate contact pad of the semiconductor transistor die.

Example 11 is the semiconductor device module according to Example 10, further comprising a single vertical contact connected with the third contact pad and extending through the encapsulant.

Example 12 is the semiconductor device module according to Example 11, further comprising a third outer metallic contact layer electrically connected to the single vertical contact.

Example 13 is the semiconductor device module according to Example 11 or 12, wherein a length of the first and second vertical contacts and the single vertical contact lies in a range from 30 μm to 1 mm.

Example 14 is the semiconductor device module according to any one of Examples 11 to 13, wherein a diameter of the vertical contacts and the single vertical contact lies in a range from 20 μm to 150 μm.

Example 15 is the semiconductor device module according to any one of the preceding Examples, further comprising a laminate layer covering at least partially the package carrier and the semiconductor die package.

Example 16 is the semiconductor device module according to Example 15, wherein the laminate layer comprises via connections connected between the first outer metallic layer and the first vertical contacts wherein the via connections have a larger lateral size than the first vertical contacts.

Example 17 is a method for fabricating a semiconductor device module, the method comprising fabricating a semiconductor die package by providing a semiconductor die, connecting first vertical contacts to the contact pad, covering at least partially the semiconductor die by an encapsulant, providing a package carrier comprising an opening, placing the semiconductor die package in the opening, and electrically connecting a first outer metallic contact layer to the first vertical contacts.

Example 18 is the method according to Example 17, wherein the vertical contacts extend at least partially through the encapsulant.

Example 19 is the method according to Example 17 or 18, wherein connecting the vertical contacts comprises nail head bonding.

Example 20 is the method according to any one of Examples 17 to 19, wherein fabricating the semiconductor die package further comprises providing a die carrier and disposing the semiconductor die on the die carrier.

Example 21 is the method according to any one of Examples 15 to 17, wherein embedding the semiconductor die by an encapsulant comprises one or more of transfer molding, compression molding or film-assisted molding.

In addition, while a particular feature or aspect of an embodiment of the disclosure may have been disclosed with respect to only one of several implementations, such feature or aspect may be combined with one or more other features or aspects of the other implementations as may be desired and advantageous for any given or particular application. Furthermore, to the extent that the terms "include", "have", "with", or other variants thereof are used in either the detailed description or the claims, such terms are intended to be inclusive in a manner similar to the term "comprise". Furthermore, it should be understood that embodiments of the disclosure may be implemented in discrete circuits, partially integrated circuits or fully integrated circuits or programming means. Also, the term "exemplary" is merely meant as an example, rather than the best or optimal. It is also to be appreciated that features and/or elements depicted herein are illustrated with particular dimensions relative to one another for purposes of simplicity and ease of understanding, and that actual dimensions may differ substantially from that illustrated herein.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A semiconductor device module, comprising:
    a package carrier comprising an opening, wherein in the opening there is disposed a semiconductor package comprising:
        a semiconductor die, an encapsulant, and first vertical contacts, wherein the encapsulant at least partially covers the semiconductor die, and the first vertical contacts are connected to the semiconductor die;
        a first outer metallic contact layer electrically connected to the first vertical contacts; and
        a laminate layer covering at least partially the package carrier and the semiconductor die,
        wherein the laminate layer forms a contiguous ring that surrounds the opening of the package carrier.

2. The semiconductor device module of claim 1, wherein the vertical contacts extend at least partially through the encapsulant.

3. The semiconductor device module of claim 1, further comprising:
    a die carrier disposed in the opening of the package carrier,
    wherein the semiconductor die is disposed on the die carrier.

4. The semiconductor device module of claim 1, wherein the semiconductor die comprises a first main face and a second main face opposite to the first main face, wherein the first contact pad is disposed on the first main face, and wherein the semiconductor die further comprises a second contact pad on the second main face.

5. The semiconductor device module of claim 4, further comprising:
second vertical contacts connected with the second contact pad and extending through the encapsulant.

6. The semiconductor device module of claim 5, further comprising:
a second outer metallic contact layer electrically connected to the second vertical contacts.

7. The semiconductor device module of claim 4, wherein the semiconductor die is a semiconductor transistor die, wherein the first contact pad is a source contact pad, and wherein the second contact pad is a drain contact pad.

8. The semiconductor device module of claim 4, wherein the semiconductor die further comprises a third contact pad disposed on the first main face, the third contact pad being a gate contact pad of the semiconductor transistor die.

9. The semiconductor device module of claim 8, further comprising:
a single vertical contact connected with the third contact pad and extending through the encapsulant.

10. The semiconductor device module of claim 9, further comprising:
a third outer metallic contact layer electrically connected to the single vertical contact.

11. The semiconductor device module of claim 9, wherein a length of the first and second vertical contacts and the single vertical contact lies in a range from 30 μm to 1 mm.

12. The semiconductor device module of claim 9, wherein a diameter of the vertical contacts and the single vertical contact lies in a range from 20 μm to 150 μm.

13. The semiconductor device module of claim 1, wherein the semiconductor die is a power semiconductor transistor die.

14. The semiconductor device module of claim 1, wherein the vertical contacts have the form of vertical needles or vertical wires.

15. The semiconductor device module of claim 1, wherein the laminate layer comprises via connections connected between the first outer metallic layer and the first vertical contacts, and wherein the via connections have a larger lateral size than the first vertical contacts.

16. A method for fabricating a semiconductor device module, the method comprising:
fabricating a semiconductor die package by providing a semiconductor die, connecting first vertical contacts to the contact pad, covering at least partially the semiconductor die by an encapsulant;
providing a package carrier comprising an opening;
placing the semiconductor die package in the opening;
electrically connecting a first outer metallic contact layer to the first vertical contacts; and
covering at least partially the package carrier and the semiconductor die by a laminate layer,
wherein the laminate layer forms a contiguous ring that surrounds the opening of the package carrier.

17. The method of claim 16, wherein the first vertical contacts extend at least partially through the encapsulant.

18. The method of claim 16, wherein connecting the first vertical contacts comprises nail head bonding.

19. The method of claim 16, wherein fabricating the semiconductor die package further comprises providing a die carrier and disposing the semiconductor die on the die carrier.

20. The method of claim 16, wherein covering at least partially the semiconductor die by an encapsulant comprises one or more of transfer molding, compression molding or film-assisted molding.

* * * * *